United States Patent [19]

Tomimitsu

[11] Patent Number: 4,899,341
[45] Date of Patent: Feb. 6, 1990

[54] ERROR CORRECTION CIRCUIT
[75] Inventor: Yasuharu Tomimitsu, Tokyo, Japan
[73] Assignee: NEC Corporation, Tokyo, Japan
[21] Appl. No.: 149,447
[22] Filed: Jan. 28, 1988
[30] Foreign Application Priority Data Jan. 28, 1987 [JP] Japan .................. 62-19301

[51] Int. Cl.$^4$ ............................. G06F 11/10
[52] U.S. Cl. ................................ 371/37.6
[58] Field of Search ........................ 371/37, 38, 39, 40

[56] References Cited
U.S. PATENT DOCUMENTS 4,498,175 2/1985 Nagumo ............................. 371/37
4,538,270 8/1985 Goodrich ........................... 371/37
4,665,523 5/1987 Citron ................................ 371/37

OTHER PUBLICATIONS

H. Shao et al., "A VLSI Design of a Pipeline Ro-ed—Solomon Decoder", IEEE 5/1985, pp. 393-402.

Primary Examiner—Jerry Smith
Assistant Examiner—Robert W. Beausoliel
Attorney, Agent, or Firm—Foley & Lardner, Schwartz, Jeffery, Schwaab, Mack, Blumenthal & Evans

[57] ABSTRACT

An error correction circuit comprises a plurality of Galois body operation units coupled in cascade through a bus but operated in parallel. Each of the units includes a Galois body multiplication circuit, a Galois body addition circuit and a plurality of registers, thereby generating and decoding a BCH code.

3 Claims, 8 Drawing Sheets

1

ERROR CORRECTION CIRCUIT

BACKGROUND OF THE INVENTION

1. Field of the Invention

The present invention relates to an error correction circuit, and more specifically to an error correction circuit for correcting errors in polynomial symbols.

2. Description of Related Art

Heretofore, three typical error correction circuits have been proposed. One of the typical error correction circuits is composed of a microprocessor system including a general purpose microprocessor adapted to execute, in accordance with predetermined programs, various operations such as an operation of Galois field in the process of error correction.

A second error correction circuit is composed of a single purpose hardware including one set of a Galois field multiplying circuit and a Galois field adding circuit. Referring to FIG. 1, there is shown a typical example of such a correction circuit, which includes a multiplier 100 coupled to a bus 102 and an adder 104 having one input connected to an output of the multiplier 100 and another input coupled to the bus 102. An output of the adder 104 is also coupled to the bus 102. Further, a memory 106 and a syndrome generator 108 are coupled to the bus 102, and a microprogram control unit 110 is coupled through a unitary delay element 112 to the bus 102.

A third typical error correction circuit is constituted of a systolic array, as shown in FIG. 2. The shown systolic array including a syndrome generator 200, an error position polynominal calculation circuit 202, an error position calculation circuit 204, an error pattern calculation circuit 206 and an error correction circuit 208, which are coupled in cascade.

However, the above mentioned error correction circuits have the following drawbacks, respectively.

Specifically, in the case that an error correction is effected by using a microprocessor system, it is necessary to execute operations such as multiplication of a Galois field in the process of error correction. However, if the multiplication of the Galois field and similar operations are performed by the general purpose microprocessor, it needs a long execution time. In most cases, it entails about ten times the time of a single purpose hardware.

The single purpose hardware including one set of a Galois field multiplication circuit and a Galois field addition circuit as shown in FIG. 1 can have a processing speed higher than the above microprocessor system. However, the processing speed is not sufficient if it is used in a high speed transmission such as a digital video transmission. Therefore, this cannot be applied to a high speed transmission system.

On the other hand, the systolic array as shown in FIG. 2 can have a sufficiently high processing speed, and therefore, can be used in a high speed transmission system. However, this needs a large scale of circuit, and therefore, it is difficult to assemble the circuit on an integrated circuit.

SUMMARY OF THE INVENTION

Accordingly, it is an object of the present invention to provide an error correction circuit which has overcome the above mentioned defects of the conventional ones.

Another object of the present invention is to provide an error correction circuit capable of executing error correction at a high speed with a small scale of circuit.

The above and other objects of the present invention are achieved in accordance with thepresent invention by an error correction circuit comprising a plurality of Galois field operation units coupled in cascade through a bus, each of the units including a Galois field multiplication circuit, a Galois field addition circuit and a plurality of registers, thereby generating and decoding a BCH code such as a Reed-Solomon code. Preferably, the number of the Galois field operation units is the same as that of check symbols.

In a specific embodiment, the circuit further comprises a controller which includes a Galois field multiplication circuit, an arithmetic logic unit, registers, a memory and a microprogram control unit. The controller is coupled to the plurality of Galois field operation units through another bus provided independently of the first named bus.

The above and other objects, features and advantages of the present invention will be apparent from the following description of the preferred embodiment of the invention with reference to the accompanying drawings.

DESCRIPTION OF THE PREFERRED EMBODIMENT

Figure 1:
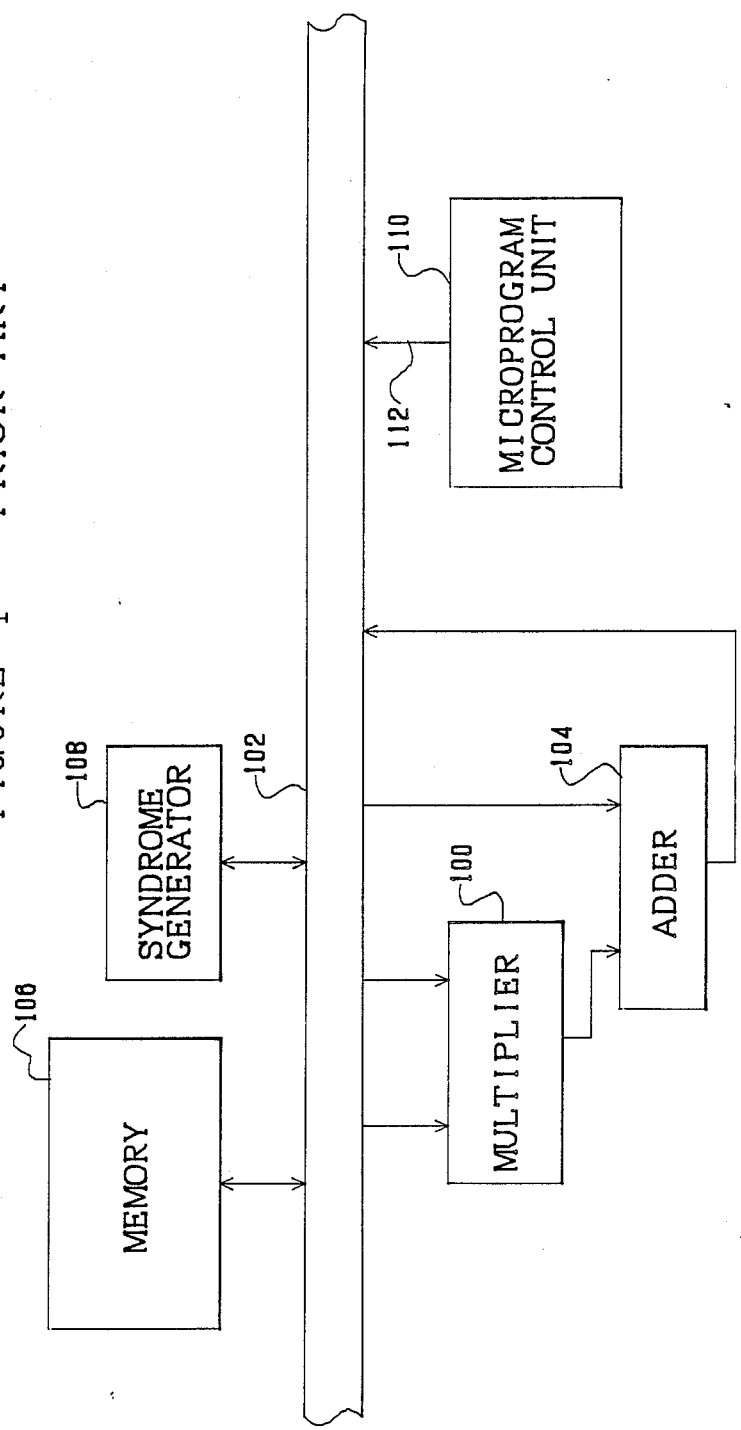
FIG. 1 is a block diagram showing one example of the conventional error correction circuit.
Figure 2:
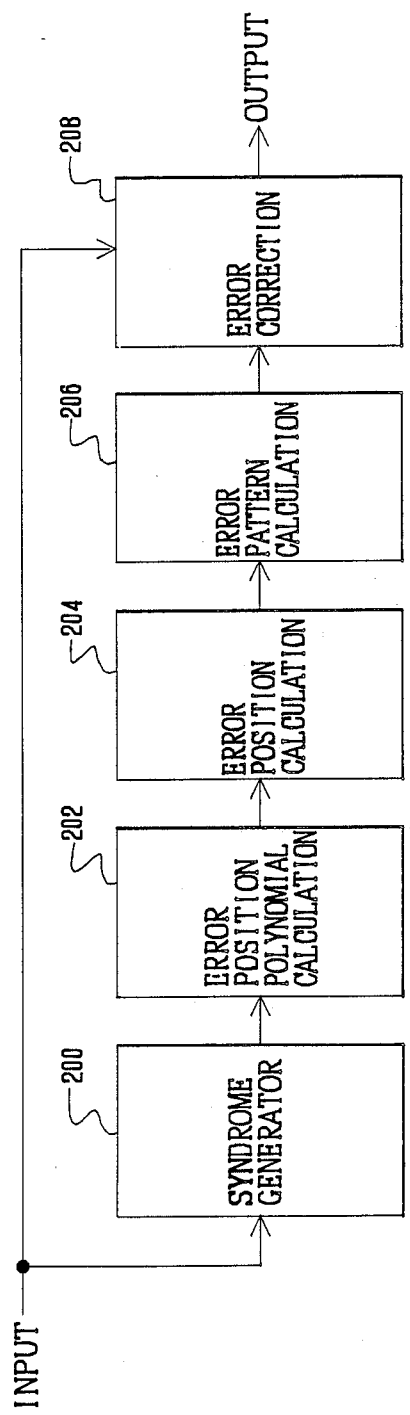
FIG. 2 is a block diagram showing another example of the conventional error correction circuit.
Figure 3:
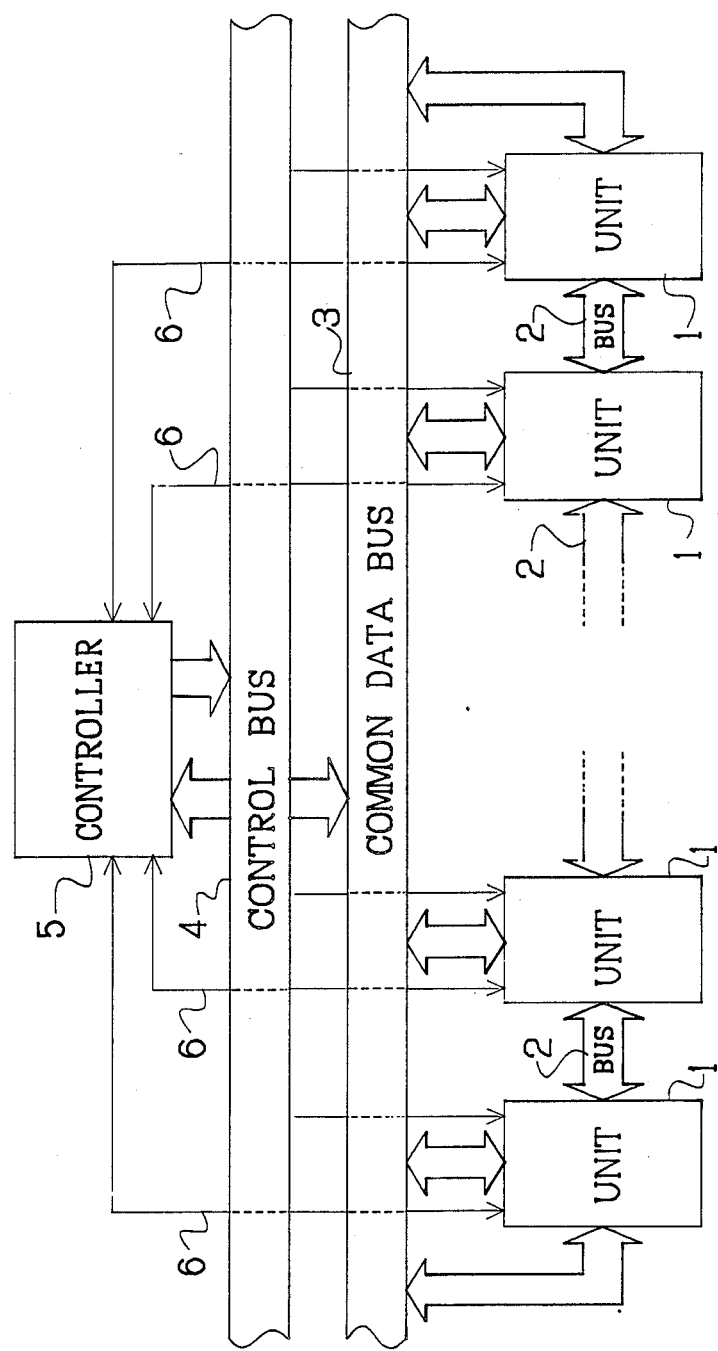
FIG. 3 is a block diagram showing one embodiment of the error correction circuit in accordance with the present invention.

Referring to FIG. 3, there is shown an overall structure of the error correction circuit in accordance with the present invention. The shown circuit includes a plurality of Galois field operation units 1 coupled in cascade through a bus 2 and also coupled commonly to a data bus 3. To this data bus 3, a controller 5 is also coupled which is connected to each of the units 1 through a control bus 4 and a zero detection signal line 6.

Figure 4:
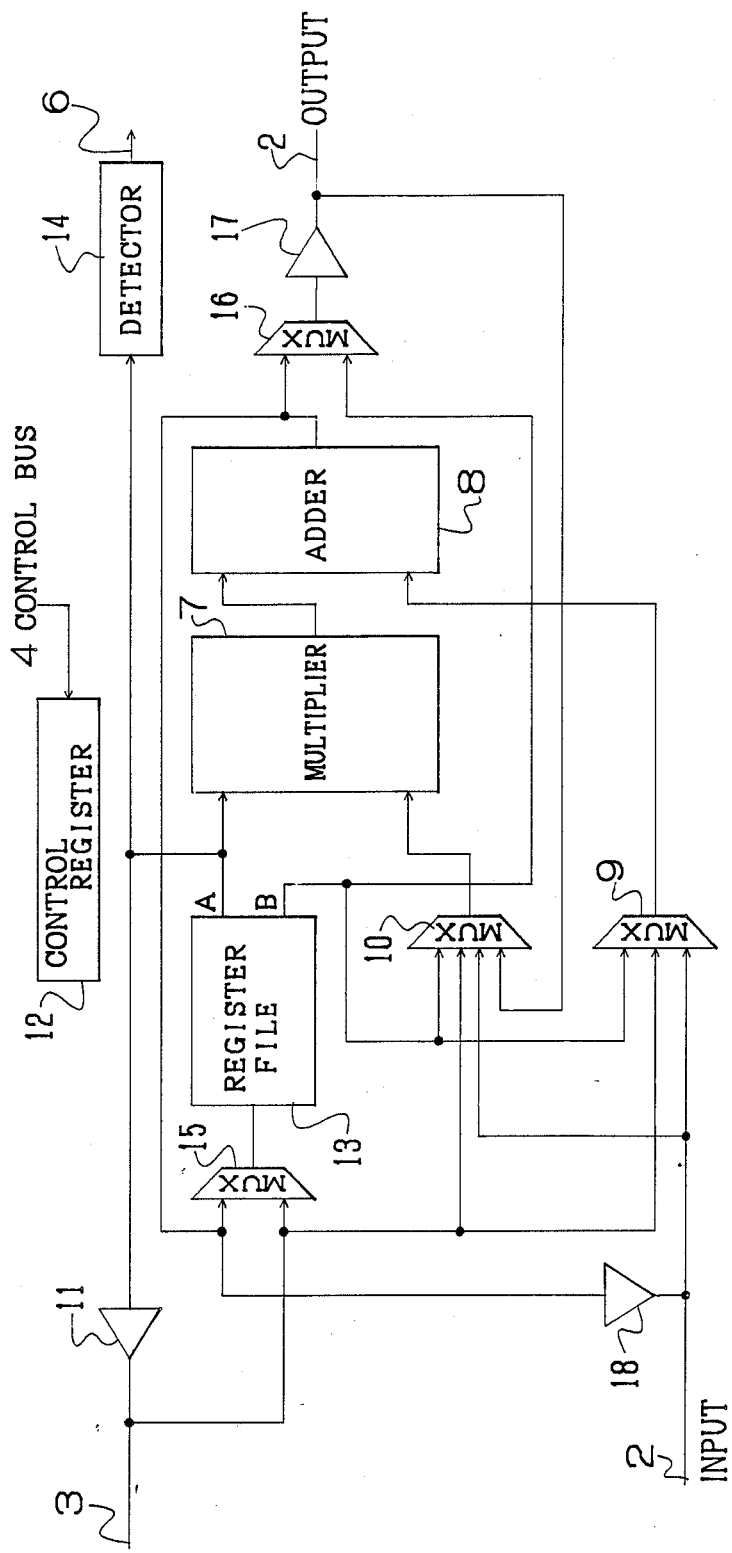
FIG. 4 is a block diagram of the Galois body operation unit incorporated in the circuit shown in FIG. 3.

Turning to FIG. 4, each of the units 1 includes a multiplication circuit 7 having an output connected to one input of an addition circuit 8. This addition circuit is connected at its other input to an output of a multiplexer 9 and at its output to one input of each of multiplexer 15 and 16. An output of the multiplexer 16 is connected to a tristate gate 17 whose output is connected to the bus 2 at an output side of the unit and is connected to a multiplexer 10. An output of this multiplexer 10 is connected to one input of the multiplication circuit 7. Further, an output of the multiplexer 15 is connected to a register file 13, which is in turn coupled at its first output A to the other input of the multiplication circuit 7, a tristate gate 11 and a zero detection circuit 14. This detection circuit is connected at its output to the zero detection signal line 6. An output of the tristate gate 11 is connected to the data bus 3, which is also connected to the inputs of the multiplexers 9, 10 and 15.

A second output B of the register file 13 is connected to a second input of the multiplexer 16, and also connected to the inputs of the multiplexers 9 and 10. In addition, the output of the addition circuit 8 is connected through a tristate gate 18 to the bus 2 at an input side of the unit, and the inputs of the multiplexers 9 and 10. Moreover, the unit 1 includes a control register 12 connected to the control bus 4 for controlling operations of the above mentioned elements.

Figure 5:
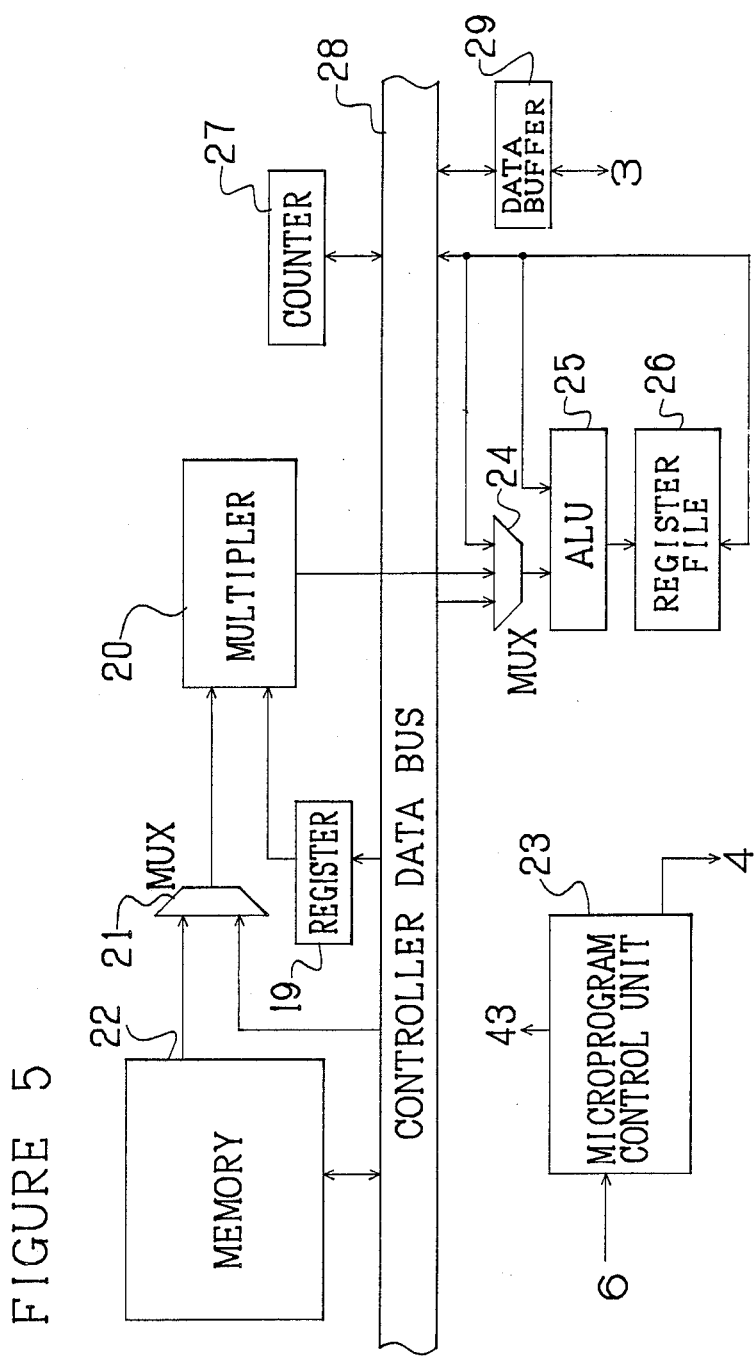
FIG. 5 is a block diagram of the controller used in the circuit shown in FIG. 3.

On the other hand, the controller 5 includes a multiplication circuit 20 as shown in FIG. 5. This multiplication circuit 20 has a first input connected to a register 19 coupled to an internal data bus 28, and a second input connected to an output of a multiplexer 21. This multiplexer 21 has a first input coupled to the internal data bus 28 and a second input coupled to a memory 22, which is also coupled to the internal data bus 28.

An output of the multiplication circuit 20 is connected to one input of a multiplexer 24, whose second input is connected to the internal data bus 28. An output of the multiplexer 24 is connected to one input of an arithmetic logic unit (ALU) 25, and whose output is coupled to a register file 26. An output of the register file 26 is connecdted to another input of the ALU 25, a third input of the multiplexer 24 and the internal data bus 28.

Further, to the data bus 28, there are coupled a counter 27 and a data buffer 29 coupled to the common data bus 3. In addition, the controller 5 includes a microprogram control unit 23 connected to receive the zero detection signal on the line 6 and to output a control signal to the control bus 4. Further, this control unit 23 generates control signals 43 for controlling operations of the above mentioned elements.

Now, description will be made on an error correction system. Heretofore, various methods have been proposed in respect of decoding a BCH code (Reed-Solomon code) for polysymbol correction. In this embodiment, however, a euclidean algorithm is adopted. Namely, in order to effectively perform decoding and error correction by means of the euclidean algorithm, the following five steps are sequentially executed:

Step 1: operation of syndrome
Step 2: derivation of error position polynomial
Step 3: derivation of error position
Step 4: operation of error pattern
Step 5: error correction Next, each of the steps will be described in detail.

STEP 1 (operation of syndrome)

In general, a check matrix H for t-place error correction BCH code is given as follows:

$$H = \begin{bmatrix} 1 & 1 & 1 & 1 & 1 \\ \alpha^{(n-1)} & \alpha^{(n-2)} & \alpha^2 & \alpha & 1 \\ \cdot & \cdot & \cdot & \cdot & \\ \cdot & \cdot & \cdot & \cdot & \\ \cdot & \cdot & \cdot & \cdot & \\ \alpha^{(2t-2)(n-1)} & \alpha^{(2t-2)(n-2)} & \alpha^{2(2t-2)} & \alpha^{2t-2} & 1 \\ \alpha^{(2t-1)(n-1)} & \alpha^{(2t-1)(n-2)} & \alpha^{2(2t-1)} & \alpha^{2t-1} & 1 \end{bmatrix} \quad (1)$$

Specifically, assuming that a code word "a" is expressed by $a=(a_0, a_1, \ldots)$ $$a H^T = 0 \quad (2)$$

If an error "e" is added to the code word "a", and a received word $y=(a+e)$ is inputted, $S(=S_0, S_1, \ldots S_{2t-1})$ can be obtained from the following formula:

$$S = y \, h^t$$

Therefore, $$S_j = \sum_{i=0}^{n-1} \alpha^{j(n-1-i)} \cdot y_i \quad (3)$$

$(j = 0 \text{ to } 2t)$ $(y = (y_0, y_1, \ldots, y_{2t-1}))$

STEP 2 (derivation of error position polynomials)

An error position polynomial is defined as follows:

$$\sigma(Z) = \pi_{i \in E} (Z - \alpha^i) = \sum_{j=0}^{\Sigma} \sigma_j Z^j \quad (4)$$

where E represents a set of errors.

As seen from the equation (4), if the error position polynomial is solved, the number of errors can be sought from the order, and the position of errors can be known from the root.

As one method for obtaining $\alpha(Z)$, the euclidean algorithm can be used.

In general, the following equation is established:

$$\sigma(Z)S(Z) + \phi(Z)Z^{2t} = \eta(Z) \quad (5)$$

where $\eta(Z)$ is an error position polynomial, which can be expressed as follows:

$$\eta(Z) = \sum_{i \in E} l_i \pi_{\substack{j \in E \\ j \neq i}} (Z - \alpha^j) \quad (6)$$

S(Z) is a syndrome polynomial expressed as follows:

$$S(Z) = \sum_{j=0}^{2t-1} S_j \cdot z^j$$

$\phi(Z)$ is expressed as follows:

$$\phi(Z) = \sum_{i \in E} 1\, i\, a^{i-2t}\, \pi\, (Z - a^j)$$

Even if S(Z) is given to the equation (5), a solution cannot be obtained. But, if the number of the errors "e" is not greater than "t", each of error patterns has one syndrome polynomial different from each other. Therefore, n(Z) and $\sigma(Z)$ can be uniformly obtained by giving S(Z).

Figure 6:
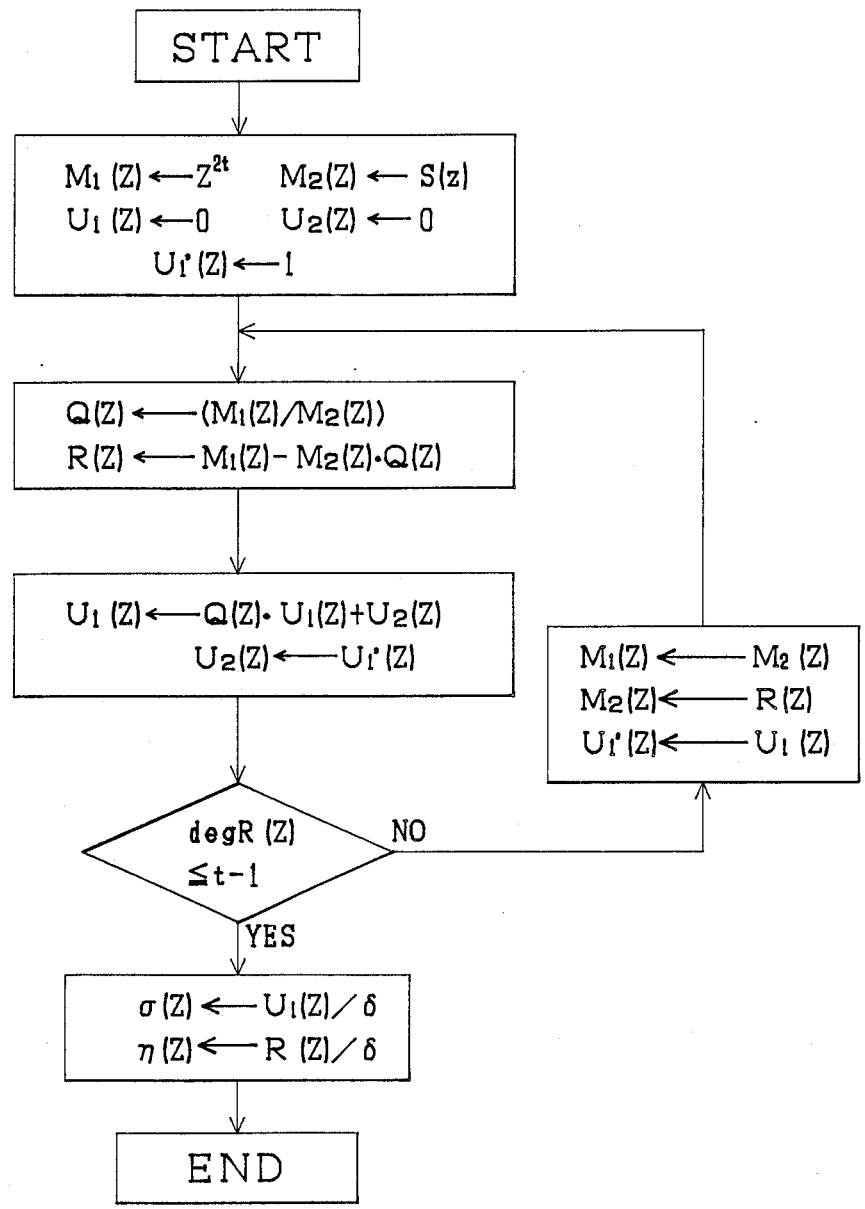
FIG. 6 is a flow chart illustrating the euclidean algorithm.

Referring to FIG. 6, there is shown a flow chart for obtaining a solution of the equation (5) on the euclidean algorithm. In FIG. 4, the bracket indicates a quotient of a division, and $\delta$ is represents a coefficient of the maximum order term of $U_1(Z)$.

STEP 3 (detection of error position)

The position of errors is given by the root of $\sigma(Z)$ derived from the euclidean algorithm. As a method for obtaining the root, Chen's algorithm can be used. In this method, $\alpha^0$ to $\alpha^{n-1}$ are sequentially substituted into the polynomial $\alpha(Z)$. A position "i" giving $\sigma(\alpha^j)=0$ is an error position.

STEP 4 (operation of error pattern)

On the basis of "i" obtained from the error position polynomial $\sigma(Z)$ derived from the euclidean algorithm, the error value polynomial $\eta(Z)$ and the Chen's algorithm, there is sought an error value $l_i$ at the error position "i". If the equation (4) is differentiated, the following is obtained.

$$\sigma'(Z) = \sum_{\substack{i \in E \\ j \neq i}} \pi\, (Z - a^j) \quad (7)$$

Substituting the error position $\alpha^i$ into the equation (7), $$\sigma'(\alpha^i) = \pi_{\substack{i \in E \\ j \neq i}} (\alpha^i - \alpha^j) \quad (8)$$

On the other hand, substituting $\alpha^i$ into the equation (6), $$\eta'(\alpha^i) = 1\, i \, \pi_{\substack{i \in E \\ j \neq i}} (\alpha^i - \alpha^j) \quad (9)$$

From the equations (8) and (9) the following equation is obtained:

$$l_i = \eta(\alpha^i)/\sigma'(\alpha^i) \quad (10)$$

Thus, an error pattern is obtained.

STEP 5 (error correction)

Since y=a+e, a=y−e. Therefore, an error can be corrected.

Next, description will be made on an operation of the above mentioned error correction circuit in accordance with the error correction system explained just above.

Assume that received words are stored in the memory 22. In this condition, $\alpha^0, \ldots \alpha^{n-1}$ are respectively suppled to one register of the register files 13 of the respective units 1, and "0" is inputted into another register of the register file for holding a syndrome. The received words are sequentially outputted from the memory 22 through the controller internal bus 28 and the data buffer 29 to the common data bus 3.

In each of the units, on the other hand, the multiplexer 9 selects the common data bus 3, and the multiplexer 15 selects the output of the addition circuit 8. Further, the multiplexer 10 selects the output of the register file 13. Thus, the following operation is repeated for data $X_i$ from the common bus 3.

$$Y_i = Y_{i-1}\alpha^j + X_i$$

where $Y_i$ is the content of (i)th register.
Here, $Y_{n-1}$ can be expressed as follows:

$$\begin{aligned} Y_n - 1 &= Y_{n-2}\, \alpha^j\, X_{n-1} \\ &= (Y_{n-3}\alpha^j + X_{n-2})\alpha^j + X_{n-1} = \\ &= \ldots \\ &= \sum_{i=0}^{n-1} \alpha^{j(n-1-i)} X_i \end{aligned}$$

Thus, the syndrome expressed by the equation (3) is generated in the another register of the register file 13.

Next, the error position polynomial (equation (4)) and the error value polynomial (equation 6)) are sought on the basis of the euclidean algorithm. This operation is mainly composed of division, multiplication and addition between polynomials.

Figure 7:
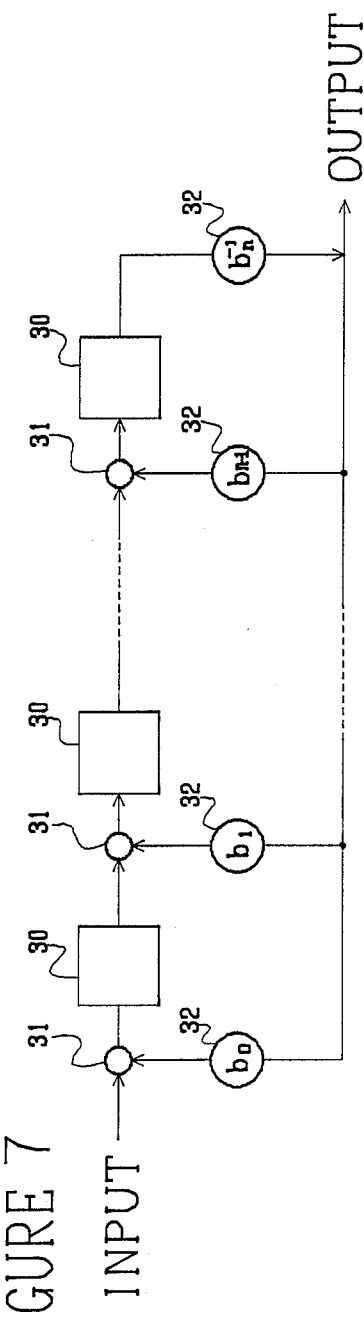
FIG. 7 is a block diagram showing a polynomial division circuit for GF $(2^n)$.

Referring to FIG. 7, one example of a division circuit is illustrated. The shown division circuit includes a plurality of unitary delay elements 30, a plurality of addition circuits 31 and a plurality of coefficient multiplication circuit 32, which are coupled as shown. In the division circuit shown in FIG. 7, a dividend polynomial is set as $b_0+b_1X+\ldots+b_nX^n$. If $a_0+a_1X+\ldots+a_mX^m$ is given as a divisor polynomial, the value of a quotient appears at an output terminal by sequentially inputting the coefficients $a_i$ (i=0 to m) of the divisor in the order from $a_m$ to $a_0$. A remainder remains in a shift register.

Figure 8:
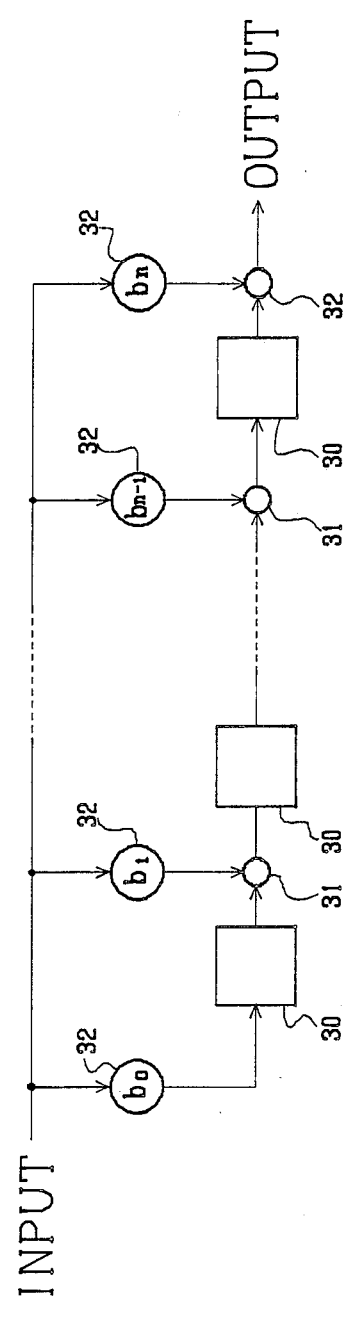
FIG. 8 is a block diagram showing a polynomial multiplication circuit for GF $(2^n)$.

Turning to FIG. 8, there is shown one example of a multiplication circuit, which includes a plurality of unitary delay elements 30, a plurality of addition circuits 31 and a plurality of coefficient multiplication circuit 32, which are coupled as shown. In the circuit shown in FIG. 8, a multiplicand polynomial is set as $b_0+b_1X+\ldots+b_nX^n$. If $a_0+a_1X+\ldots+a_mX^m$ is given as a multiplier polynomial, the value of a product appears at an output terminal by sequentially inputting the coefficient $a_i$ (i=0 to m) of the multiplier in the order of $a_m$ to $a_0$.

Thus, the above mentioned calculation can be executed by realizing a set of an addition circuit, an unitary delay element and a coefficient multiplication circuit in each of the units.

The data inputted through the multiplexer 10 from the common data bus 3 is multiplied by a coefficient in the register file 13, and the product outputted from the multiplication circuit 7 is added with a content of a certain register of the register file of a just before unit inputted through the multiplexer 9 from the cascade-coupling bus 2. The result of the addition is inputted in the register file 13 through the multiplexer 15. This register corresponds to the delay element shown in FIGS. 7 and 8.

Further, the output data is stored in the register of any unit through the common data bus.

In the case of division operation, a calculation of the inverse of the output is executed with reference to an inverse number table in the memory 22 of the controller 5, and then, the obtained inverse number is outputted to the common data bus, and further fed back to the unit which has outputted the data.

On the other hand, in the case of multiplication operation, the data to be inputted is outputted from the register concerned to the common data bus 3, and then, latched in the data bus buffer 29 of the controller 5. Thereafter, the data is outputted to the common data bus 3, again, and supplied to each of the units.

In each of the units 1, the output A of the register file is connected to the zero detection circuit 14, whose output is then supplied to the microprogram control unit 23, so that the order of each polynomial is judged in the controller 5. Specifically, the judgement of deg $R(Z) \leq t-1$ in FIG. 6 is performed in this method.

Further, $$\sigma(Z)\text{-}U_1(Z)/\delta$$

$$\eta(Z)\text{-}R(Z)/\delta$$

are carried out in each unit by addition and multiplication (after derivation of the inverse number). Thus, $\sigma(Z)$ and $\eta(Z)$ can be obtained in the above method.

Figure 9:
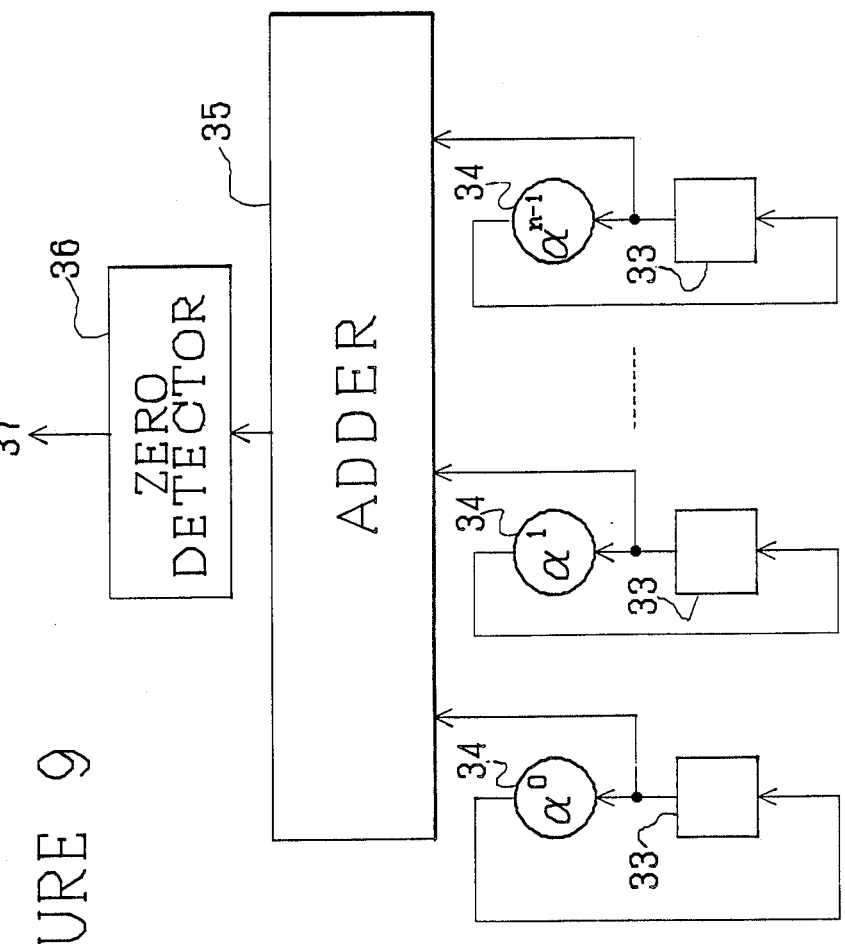
FIG. 9 is a block diagram of a circuit for executing Chen's algorithm.

Now, explanation will be made on execution of Chen's algorithm. For example, Chen's algorithm can be executed by using a circuit shown in FIG. 9. The shown circuit includes a plurality of calculation loops each composed of a unitary delay element 33 and a coefficient multiplication circuit 34. A node between the delay element 33 and the input of the coefficient multiplication circuit in each loop is connected to an addition circuit 35, whose output is then connected to a zero detection circuit 36. An output of the circuit 36 is connected to an output node 37. Coefficients of $\sigma(Z)$ are set as an initial value, and then, each coefficient is sequentially multiplied by $\alpha^0, \alpha^1, \ldots \delta^{m-1}$ so that all of the products are summed. This operation is repeated until the sum of the products become zero. The number of repetitions represents the error position.

In order to realize the above processing in each of the units, the coefficient of $\sigma(Z)$ and $\alpha^0, \alpha^1, \ldots \delta^{m-1}$ are read out from the register file, and then, multiplication is executed. In addition, the cascade-coupling bus 2 is selected from the multiplexer 9, so that the result of the multiplication is sequentially supplied to the addition circuit. Thus, the result of the calculation is obtained.

In the case of the t-order error correction, the number of required units is 2t, but $\sigma(Z)$ is not greater than t-order. Therefore, there is confirmed that a zero is detected by the zero detection circuit 13 in a unit next to a unit of the highest order. The number of repetition is counted by the counter 27, and when the result becomes zero, the value of the counter is transferred to the memory 22.

Thus, all the error positions is finally stored in the memory 22.

Next, the error pattern is calculated. The numerator $\eta(\alpha^i)$ of the equation (10) can be repeatedly calculated, similarly to the syndrome:

$$Y_{i+1} = \eta_i + \alpha^i \cdot Y_i$$

$$\left( \eta(Z) = \sum_{i=0} \eta_i \cdot Z^i \right)$$

The coefficients of $\eta(Z)$ are stored in respective registers in the order of a low place to a high place from the leftmost unit to the rightmost unit in FIG. 3. Thereafter, the tristate gate 17 is put in a high impedance condition, so that the data is inputted from the output side of the tristate gate 17 through the multiplexer 10 to the multiplication circuit 7. A content of the register storing the error position which has been transferred from the memory of the controller 5, is inputted as another input to the multiplication circuit 7. On the other hand, $\eta_i$ is outputted from the register file 13 through the multiplexer 9 to the addition circuit 8 receiving the result of the multiplication from the circuit 7. The result of the addition is supplied through the tristate gate 18 to the cascade-coupling bus. Thus, $\eta(\alpha^i)$ ca be obtained.

Further, operation of denominator is explained. The denominator is a product of sums of an error position related to the other error positions. Error positions are sequentially stored in the registers of the respective units in the order of the output from the controller 5. Next, the error positions are sequentially outputted from the controller 5 to each of the units, so that the inputted error position is added to the error position stored in each unit, and the result of the addition is stored in another register in the same unit. Thereafter, the results of additions are multiplied through the cascade-coupling bus. Thus, the denominator is obtained.

Then, operation of the equation is performed in the controller 5, and an error correction is also executed in the controller 5.

As seen from the above, the above mentioned error correction circuit comprises a plurality of parallel-arranged units each including an addition circuit and a multiplication circuit, so that required processings are parallel-executed by the units. Therefore, it is possible to execute an error correction at a high speed which is several times to several ten times the speed of a conventional system including only one set of addition circuit and multiplication circuit.

Further, in comparison with a systolic array which needs a hardware for each step, the circuit of the present invention needs only a reduced scale of circuit, since the hardware are used commonly to the respective steps. Specifically, each unit can be formed of 1000 gates. Therefore, even if one gate is composed of four transistors by CMOS technique, the circuit can be assembled on an integrated circuit. Further, for t-order error correction, it is sufficient if 2t units are prepared. Therefore, it has a high extensibility.

The invention has thus been shown and described with reference to the specific embodiment. However, it should be noted that the invention is in no way limited to the details of the illustrated structures but changes and modifications may be made within the scope of the appended claims.

I claim:

1. An error correction circuit comprising a plurality of Galois field operations units coupled in cascade through a first bus but operated in parallel, and a controller coupled to said plurality of Galois field operation units thorough a second bus provided independently of said first bus, wherein each of the units includes:
- a first multiplexer having a first input connected to the bus;
- a register file connected to an output of the first multiplexer;
- a multiplication circuit having a first input connected to a first output of the register file, the multiplication circuit being connected at its output to a second input of the first multiplexer;
- an addition circuit having a first input connected to the output of the multiplication circuit;
- a second multiplexer having a first input connected to an output of the addition circuit and a second input connected to a second output of the register file;
- a first tristate gate connected at its input to the output of the second multiplexer and connected at its output to an output of the unit;
- a second tristate gate connected between the first output of the register file and the first input of the first multiplexer;
- a third multiplexer having inputs connected to the second outputs of the register file, the first input of the first multiplexer, the bus at an input side of the unit, and the output of the first tristate gate, respectively, an output of the third multiplexer being connected to a second input of the multiplication circuit; and
- a forth multiplexer having inputs connected to the second output of the register file, the first input of the first multiplexer, and the bus at an input side of the unit, respectively, an output of the fourth multiplexer being connected to a second input of said addition circuit.

2. A circuit claimed in claim 1 wherein the controller includes a multiplication circuit having a first input connected to a register coupled to an internal data bus and a second input connected to an output of a first multiplexer, which has a first input coupled to the internal data bus and a second input coupled to a memory also coupled to the internal data bus, an output of the multiplication circuit being connected to one input of a second multiplexer, whose second input is connected to the internal data bus and whose output is connected to one input of an arithmetic logic unit, whose output is coupled to a register file, an output of the register file being connected to another input of the arithmetic logic unit, a third input of the second multiplexer and the internal data bus, the data bus is also coupled to a counter and a data buffer.

3. An error correction circuit comprising:
 (a) a plurality of Galois field operation units coupled in cascade through a first bus and operated in parallel, each of said units including:
   (1) a register file coupled to receive data to be corrected,
   (2) A Galois field multiplication circuit having a first input connected to the data stored in said register file and a second input connected to receive another data through the first bus from a first adjacent unit, and
   (3) a Galois field addition circuit having a first input connected to an output of said Galois field multiplication circuit and a second input connected to receive another data through the first bus from said adjacent unit, an output of said Galois field addition circuit being connected to a second adjacent unit through the first bus; and
 (b) a controller coupled to said plurality of Galois field operation units through a second bus provided independently of said first bus, said controller unit including:
   (1) a memory storing the data to be corrected, a register file,
   (2) a Galois field multiplication circuit having a first input coupled to said memory and a second input connected to said register file,
   (3) an arithmetic logic unit connected to an output of said Galois field multiplication circuit, and
   (4) a microprogram control unit for controlling the operations of said plurality of Galois field operation units.

* * * * *